US009548095B2

(12) United States Patent
Houssameddine et al.

(10) Patent No.: US 9,548,095 B2
(45) Date of Patent: Jan. 17, 2017

(54) REDUNDANT MAGNETIC TUNNEL JUNCTIONS IN MAGNETORESISTIVE MEMORY

(71) Applicant: Everspin Technologies, Inc., Chandler, AZ (US)

(72) Inventors: Dimitri Houssameddine, Gilbert, AZ (US); Jon Slaughter, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 14/697,577

(22) Filed: Apr. 27, 2015

(65) Prior Publication Data

US 2016/0055894 A1    Feb. 25, 2016

Related U.S. Application Data

(60) Provisional application No. 62/039,800, filed on Aug. 20, 2014.

(51) Int. Cl.
*G11C 11/00* (2006.01)
*G11C 11/16* (2006.01)
*G11C 29/00* (2006.01)

(52) U.S. Cl.
CPC .......... *G11C 11/1659* (2013.01); *G11C 11/161* (2013.01); *G11C 11/1673* (2013.01); *G11C 11/1675* (2013.01); *G11C 29/70* (2013.01); *G11C 29/74* (2013.01); *G11C 29/838* (2013.01); *G11C 2213/78* (2013.01); *G11C 2213/79* (2013.01)

(58) Field of Classification Search
CPC ........................................ G11C 11/00

USPC ................................................. 365/148, 158
See application file for complete search history.

(56) References Cited

U.S. PATENT DOCUMENTS

| 6,072,718 | A | 6/2000 | Abraham et al. |
| 6,473,337 | B1 | 10/2002 | Tran et al. |
| 6,862,212 | B2* | 3/2005 | Nickel ............... G11C 11/15 257/30 |
| 6,911,710 | B2* | 6/2005 | Nickel ............... G11C 11/15 257/421 |
| 7,791,917 | B2* | 9/2010 | Nozieres ............. G11C 11/16 365/148 |
| 2002/0036331 | A1* | 3/2002 | Nickel ............... G11C 11/15 257/421 |

(Continued)

OTHER PUBLICATIONS

International Searching Authority, International Search Report and Written Opinion mailed Nov. 4, 2015 for International Application No. PCT/US15/45001.

*Primary Examiner* — Harry W Byrne

(57) ABSTRACT

Memory cells in a spin-torque magnetic random access memory (MRAM) include at least two magnetic tunnel junctions within each memory cell, where each memory cell only stores a single data bit of information. Access circuitry coupled to the memory cells are able to read from and write to a memory cell even when one of the magnetic tunnel junctions within the memory cell is defective and is no longer functional. Self-referenced and referenced reads can be used in conjunction with the multiple magnetic tunnel junction memory cells. In some embodiments, writing to the memory cell forces all magnetic tunnel junctions into a known state, whereas in other embodiments, a subset of the magnetic tunnel junctions are forced to a known state.

20 Claims, 6 Drawing Sheets

(56) References Cited

U.S. PATENT DOCUMENTS

| | | | | |
|---|---|---|---|---|
| 2004/0090844 A1* | 5/2004 | Nickel | .................... | G11C 11/15 365/200 |
| 2004/0125649 A1* | 7/2004 | Durlam | .................. | G11C 11/16 365/158 |
| 2005/0167657 A1* | 8/2005 | Nickel | .................... | G11C 11/16 257/30 |
| 2008/0084724 A1* | 4/2008 | Nozieres | ................ | G11C 11/16 365/50 |
| 2009/0109719 A1* | 4/2009 | Nozieres | ................ | G11C 11/16 365/50 |
| 2013/0272059 A1 | 10/2013 | Lin et al. | | |

* cited by examiner

REDUNDANT MAGNETIC TUNNEL JUNCTIONS IN MAGNETORESISTIVE MEMORY

CROSS REFERENCE TO RELATED APPLICATIONS

This application claims priority to U.S. Provisional Application No. 62/039,800 filed Aug. 20, 2014. The content of that provisional application is incorporated by reference herein in its entirety.

TECHNICAL FIELD

The disclosure herein relates generally to spin-torque magnetic memory devices and more particularly to the inclusion of multiple magnetic tunnel junctions in a memory cell storing a single data bit.

BACKGROUND

Resistive memory devices store information by controlling the resistance across each memory cell such that a read current through the memory cell will result in a voltage drop having a magnitude that is based on the information stored in the memory cell. For example, in certain magnetic memory devices, the voltage drop across a magnetic tunnel junction (MTJ) in each memory cell can be varied based on the relative magnetic states of the magnetoresistive layers within the memory cell. In such memory devices, there is typically a portion of the magnetic tunnel junction that has a fixed magnetic state and another portion that has a free magnetic state that can be controlled relative to the fixed magnetic state. Because the resistance through the memory cell changes based on the magnetic orientation of the free portion, information can be stored by setting the orientation of the free portion. The information is later retrieved by sensing the orientation of the free portion. Such magnetic memory devices are well known in the art.

Writing to magnetic memory cells can be accomplished by sending a spin-polarized write current through the memory device where the angular momentum carried by the spin-polarized current can change the magnetic state of the free portion. Depending on the direction of the current through the memory cell, the resulting magnetization of the free portion will either be in a first state or a second state relative to the fixed portion. In some spin torque devices, the first and second states correspond to the free portion being parallel to the fixed portion and anti-parallel to the fixed portion, respectively. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Initiating the write current or "programming current" through the memory cell may be accomplished by applying a voltage pulse across the memory cell. Because of potential defects in the structure of the magnetic tunnel junction within the cell, high programming voltages, or other reasons, the repeated application of the voltage pulses and resulting write current may cause dielectric breakdown of the tunnel barrier within the magnetic tunnel junction of the memory cell. When such breakdown or some other failure of the tunnel barrier occurs, the memory cell is no longer functional and cannot be read from or written to. As such, there is a need for robust magnetoresistive memory cells that are not as susceptible to failure in response to repeated programming operations.

DETAILED DESCRIPTION

Figure 1:
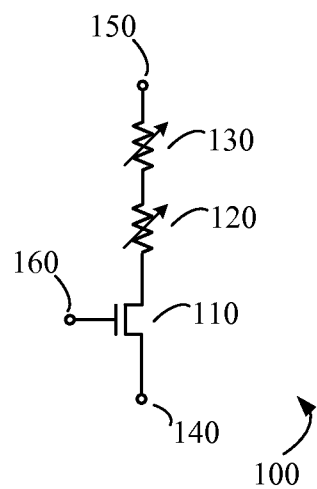
FIG. 1 is a schematic diagram of a magnetic memory cell in accordance with an exemplary embodiment.

The following detailed description is merely illustrative in nature and is not intended to limit the embodiments of the subject matter or the application and uses of such embodiments. Any implementation described herein as exemplary is not necessarily to be construed as preferred or advantageous over other implementations.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments.

The terms "comprise," "include," "have" and any variations thereof are used synonymously to denote non-exclusive inclusion. The term "exemplary" is used in the sense of "example," rather than "ideal." During the course of this description, like numbers may be used to identify like elements according to the different figures that illustrate the various exemplary embodiments.

In the interest of conciseness, conventional techniques, structures, and principles known by those skilled in the art may not be described herein, including, for example, standard magnetic random access memory (MRAM) process techniques, fundamental principles of magnetism, and basic operational principles of memory devices. Similarly, conventional techniques related to reading and writing data in memory cells, and other functional aspects of certain systems and subsystems (and the individual operating components thereof) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

Nonvolatile memory devices are often used in various applications in order to store data that remains valid after power is no longer applied. Examples of such nonvolatile memory devices include resistive memory devices such as MRAMs in which the resistance experienced by current flowing through the memory cell varies based on the orientation of magnetic vectors within the memory cell and where such resistance variations are used to store data. As noted above, spin torque memory devices send a current through the magnetoresistive stack in order to store information in a magnetic tunnel junction within a memory cell. Depending on the direction of the current, and assuming it has adequate magnitude, the free portion of the magnetic tunnel junction will be forced into a corresponding magnetic state indicative of the information to be stored in the cell.

In order to increase the robustness of memory cells, embodiments are presented herein in which each memory cell includes multiple magnetic tunnel junctions coupled in series, where a single data bit of information is stored in the memory cell. By including more than one magnetic tunnel junction within the memory cell, the cell can still be read from and written to if one of the magnetic tunnel junctions is defective because of tunnel barrier breakdown or some other reason. Such multiple-MTJ memory cells also provide additional benefits such as lower cell-to-cell variation in electrical properties as individual deviations in such electrical properties by one of the MTJs can be "balanced out" or reduced in degree by the other MTJ(s) within the memory cell.

Many of the embodiments discussed below present a memory cell having two magnetic tunnel junctions coupled in series. However, the present disclosure contemplates memory cells including more than two magnetic tunnel junctions as well, and it should be appreciated that the teachings presented with respect to two-MTJ memory cells are also applicable to memory cells including three, four, or more magnetic tunnel junctions. In some of the multi-MTJ memory cell embodiments described herein, self-referenced reads are used to determine the single data bit stored in each memory cell. In other embodiments, a referenced read is employed, where the referenced read may choose the particular reference to compare with the memory cell based on a determination as to how many magnetic tunnel junctions within the memory cell are still functional or are being switched to store each of the binary states within the memory cell.

In some cases, the magnetic tunnel junctions within the memory cell are manufactured to closely match each other in terms of physical and electrical characteristics. In other embodiments, the magnetic tunnel junctions within a single memory cell may be intentionally different. For example, one magnetic tunnel junction may have a higher tunnel junction resistance (RA) than the other or may have different materials included in the various layers of the magnetic tunnel junction.

In some embodiments, manufacturing memory cells including multiple magnetic tunnel junctions uses the same process steps to form each of the magnetic tunnel junctions at the same time. In other embodiments, a separate set of processing steps is used to form each of the magnetic tunnel junctions. Numerous combinations and variations are presented below in additional detail.

FIG. 1 is a schematic block diagram of a memory cell 100. Memory cell 100 includes a selection transistor 110, a first magnetic tunnel junction 120, and a second magnetic tunnel junction 130 coupled in series with the first magnetic tunnel junction 120. The gate 160 of the selection transistor 110 is used to select the particular memory cell 100 for reading and writing operations. Nodes 140 and 150 are selectively coupled to signal lines within the memory device such that read and write currents can be caused to flow through the memory cell 100. For example, nodes 140 and 150 may be selectively coupled to a bit line and a source line, wherein the bit line and source line are used to apply a voltage across the memory cell 100 that results in current flow through the memory cell 100 in either the upward or downward direction. The magnitude and direction of the current flow through the memory cell 100, or the magnitude and polarity of the voltage applied across the nodes 140 and 150, can be controlled as needed to support reading from and writing to the memory cell 100. It should be noted that the relative positioning of the selection transistor 110, the first magnetic tunnel junction 120, and the second magnetic tunnel junction 130 can be rearranged while still maintaining the series circuit. For example, in some embodiments the selection transistor 110 is between the second magnetic tunnel junction 130 and the node 150, whereas in other embodiments, the selection transistor 110 is between the two magnetic tunnel junctions 120 and 130.

As noted above, while memory cell 100 is shown to include two magnetic tunnel junctions 120 and 130, other embodiments include three or more magnetic tunnel junctions coupled in series in a manner similar to that shown in FIG. 1. Thus, a single selection transistor 110 is used to control whether current flows through multiple magnetic tunnel junctions connected in series. The state of both of the magnetic tunnel junctions 120 and 130 is used in determining the single data bit stored within the memory cell 100. Thus, even though there are two magnetic tunnel junctions 120 and 130 within the memory cell 100, only a single data bit is stored therein. By using two or more magnetic tunnel junctions to store a single data bit of information, redundancy is achieved and the memory cell 100 can continue to function if one of the magnetic tunnel junctions 120 and 130 is defective. A defective magnetic tunnel junction is one that is not performing as intended such that if the defective tunnel junction were the only magnetic tunnel junction in the memory cell, the memory cell would be unable to provide read/write functionality. Examples of defective tunnel junctions include partially shorted tunnel junctions, tunnel junctions in which the tunnel barrier is in a breakdown state, and tunnel junctions in which a processing defect compromises the electrical characteristics of the tunnel junction.

Access circuitry coupled to the memory cell 100 is used to read data from and write data to the memory cell 100. The access circuitry is capable of reading the single data bit stored within the memory cell 100 when only one of the magnetic tunnel junctions 120 and 130 is functional, and the other is shorted or unable to switch for some other reason. As discussed in further detail below, such reading can be accomplished using a self-referenced reading technique or by comparison with a reference. Sense amplifiers and write drivers, which are not shown in FIG. 1, enable read and write currents to be passed through selected memory cells to both store information and later retrieve that information. Examples of such sense amplifiers, write drivers, and related circuitry are discussed in U.S. Pat. No. 8,811,071. In a memory that includes an array of memory cells, the access circuitry is capable of reading and writing data to all of the memory cells even when one of the magnetic tunnel junctions within some of the memory cells is defective or non-functioning.

Writing to the memory cell 100 can be accomplished in a manner similar to that used for programming a conventional spin torque MRAM memory cell that only includes a single magnetic tunnel junction. When a programming voltage is applied across the memory cell 100, the resulting current will flow through both of the magnetic tunnel junctions 120 and 130. Assuming the current is of sufficient magnitude, one or both of the magnetic tunnel junctions 120 and 130 may be caused to change state (i.e. have their free layer change from a first magnetic orientation state to a second magnetic orientation state). The orientation of the free layer in each of the magnetic tunnel junctions 120 and 130 determines the resistance through the magnetic tunnel junction when the magnetic tunnel junction is not in a defective state in which the tunnel barrier is compromised. In the example illustrated, because the magnetic tunnel junctions 120 and 130 are coupled in series, the current will flow in the same direction through both magnetic tunnel junctions, therefore applying the same spin torque polarity to the free layers of both of the magnetic tunnel junctions 120 and 130.

Figure 2:
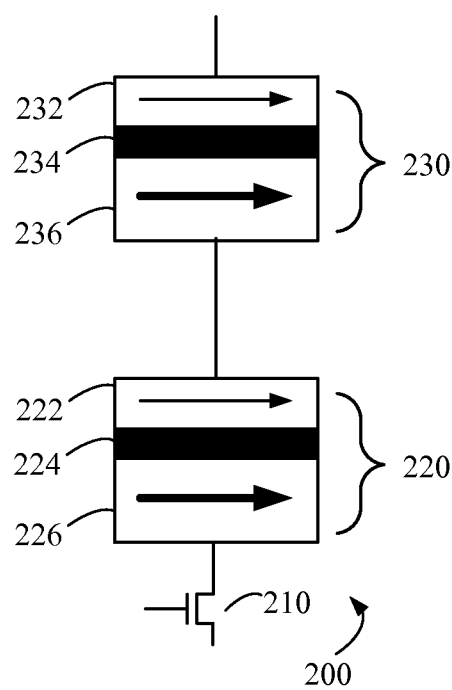
FIG. 2 is a schematic diagram of a magnetic memory cell in accordance with an exemplary embodiment.

Turning to FIG. 2, a memory cell 200 is depicted that includes two magnetic tunnel junctions 220 and 230 coupled to a selection transistor 210. The magnetic tunnel junction 230 includes a free portion, or free layer, 232, a tunnel barrier layer 234, and a fixed portion, or fixed layer, 236. The magnetic tunnel junction 230 shown in FIG. 2 is depicted as a simple magnetic tunnel junction having a free layer 232, a tunnel barrier 234, and a fixed layer 236. Such a simple magnetic tunnel junction is used herein for illustrative purposes. In some embodiments, more complex magnetic tunnel junctions are used in conjunction with the various teachings disclosed herein. For example, the layers in the magnetoresistive stack for each of the magnetic tunnel junctions 220 and 230 may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, the fixed layer 236 may include a set of layers forming a synthetic antiferromagnetic structure (SAF), and the free layer 232 may include a set of layers corresponding to a synthetic ferromagnetic structure (SYF). Notably, each of the layers shown to be included in the magnetic tunnel junctions 230 and 220 may be a composite layer that includes multiple sub-layers. Other embodiments may include multiple SAFs, SYFs, and tunnel barriers in addition to the other layers, where the materials and structures are arranged in various combinations and permutations now known or later developed. In addition, the conductive layers that serve as electrodes for the magnetic tunnel junctions, which are well known in the art, are not depicted in FIG. 2 or the other figures to simplify presentation of the concepts disclosed herein.

In the embodiment of FIG. 2, each of the magnetic tunnel junctions 220 and 230 is manufactured using a separate set of processing steps. For example, after circuitry corresponding to the selection transistor 210 is formed, a first set of processing steps is used to construct the first magnetic tunnel junction 220. Such processing steps can include deposition of the various layers of material making up the fixed layer 226, the tunnel barrier 224, and the free layer 222. One or more etching steps is then used to etch the deposited layers of material to form the magnetic tunnel junction 220 such that it has the desired dimensions in both the horizontal plane as well as the vertical plane. In one example embodiment, following formation of the magnetic tunnel junction 220, interlayer dielectric is formed overlying the magnetic tunnel junction 220. A via is formed within the interlayer dielectric, thereby permitting electrical contact between the magnetic tunnel junction 220 and an overlying second magnetic tunnel junction 230 subsequently formed with a second set of processing steps.

Because the magnetic tunnel junctions 220 and 230 included in memory cell 200 are formed using separate processing steps, it may be more challenging to form those magnetic tunnel junctions such that they are generally matched in terms of electrical characteristics. However, having separate processing steps for forming each of the magnetic tunnel junctions 220 and 230 enables those magnetic tunnel junctions to readily be produced with different electrical characteristics, which is desirable in some embodiments. For example, in one embodiment, the tunnel barrier 224 of magnetic tunnel junction 220 is thinner than the tunnel barrier 234 of magnetic tunnel junction 230. In such an embodiment, the second magnetic tunnel junction 230 has a greater tunnel junction resistance than the first magnetic tunnel junction 220 because of the thicker tunnel barrier 234. As such, the second magnetic tunnel junction 230 is more robust and less likely to break down than the first magnetic tunnel junction 220, but a higher programming voltage is required to cause the magnetic tunnel junction 230 to change state. In other example embodiments, the free layers 232 and 222 are formed with different materials or different dimensions, thereby resulting in the two magnetic tunnel junctions having different electrical characteristics. It should be appreciated that some embodiments benefit from having magnetic tunnel junctions with similar electrical properties, whereas other embodiments benefit from magnetic tunnel junctions with dissimilar characteristics.

Figure 3:
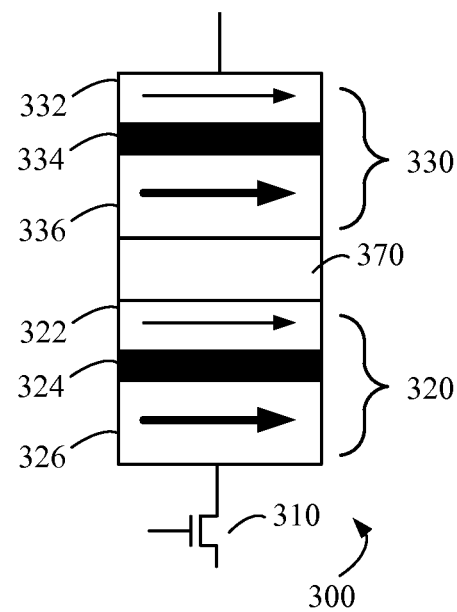
FIG. 3 is a schematic diagram of a magnetic memory cell in accordance with another exemplary embodiment.

FIG. 3 illustrates another embodiment of a memory cell 300 in which multiple magnetic tunnel junctions 320 and 330 are included in one magnetoresistive stack structure. As shown in FIG. 3, a selection transistor 310 is used to select the memory cell 300, which also includes a first magnetic tunnel junction 320 separated from a second magnetic tunnel junction 330 by a layer 370. The layer 370 may be a conductive layer that couples the magnetic tunnel junction 320 with the magnetic tunnel junction 330 in series. In other embodiments, the layer 370 is a composite material or includes multiple sub-layers. As shown, the magnetic tunnel junction 320 includes a free layer 322, a tunnel barrier 324, and a fixed layer 326. Similarly, magnetic tunnel junction 330 includes free layer 332, tunnel barrier 334, and fixed layer 336.

The multiple magnetic tunnel junctions 320 and 330 of memory cell 300 may be formed using a single set of processing steps, which may include multiple deposition steps, multiple etching steps, and potentially encapsulation of certain layers during multi-step etching of the magnetic tunnel junctions 320 and 330. In one example, each of the layers corresponding to the magnetoresistive stack of memory cell 300 is deposited overlying a via that provides an electrical connection to the selection transistor 310. Following deposition, masking and etching of the deposited layers is used to form the two magnetic tunnel junctions 320 and 330. As was the case with FIG. 2 above, the conductive layers corresponding to top and bottom electrodes for the stack are not shown in order to simplify depiction of the embodiment.

Although FIG. 3 shows the layers corresponding to each of the magnetic tunnel junctions 320 and 330 being separated by layer 370, in other embodiments, there may be intermediary layers between the magnetic tunnel junctions 320 and 330 that are shared between the two magnetic tunnel junctions in the sense that such layers are functionally related to both of the magnetic tunnel junctions. For example, one or more magnetic layers may be placed between the magnetic tunnel junctions 320 and 330, where the effects of such magnetic layers impact both magnetic tunnel junctions 320 and 330 at the same time or at different points in time. Such layers may provide additional spin-polarization or magnetic fields beneficial to device operation.

Figure 4:
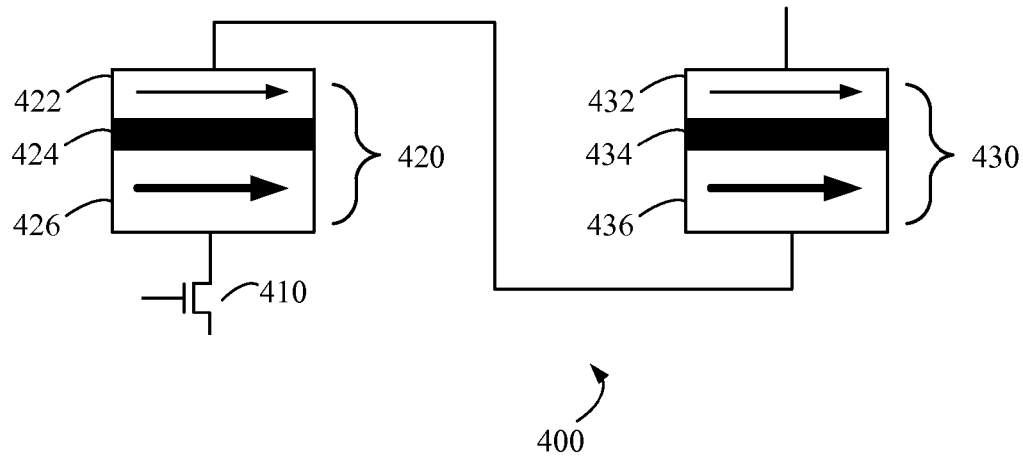
FIG. 4 is a schematic diagram of a magnetic memory cell in accordance with yet another exemplary embodiment.

FIG. 4 shows a memory cell 400 that includes selection transistor 410 coupled in series with a magnetic tunnel junction 420 and a magnetic tunnel junction 430. In the memory cell 400, the magnetic tunnel junctions 420 and 430 can be formed simultaneously using the same processing steps such that the various layers making up the magnetic tunnel junctions 420 and 430 are very similar in terms of thickness and resulting electrical characteristics. For example, the magnetic tunnel junctions 420 and 430 can be formed by first depositing the layer(s) of material corresponding to the fixed layers 426 and 436, then depositing the layer(s) of material corresponding to the tunnel barriers 424 and 434, and then depositing the layer(s) corresponding to the free layers 422 and 432. Thus, the fixed layers 426 and 436 for the magnetic tunnel junctions 420 and 430 are initially a single uniform layer or set of layers of material, where that layer is later etched to form the individual fixed layers 426 and 436 corresponding to the magnetic tunnel junctions 420 and 430, respectively.

Notably, the embodiment shown in FIG. 4 requires fewer processing steps to form the multiple magnetic tunnel junctions for the memory cell 400 in comparison to the embodiments illustrated in FIGS. 2 and 3. As another point of differentiation, the multiple magnetic tunnel junctions in FIGS. 2 and 3 are offset vertically from each other and thereby limit the die area required to support the multiple magnetic tunnel junctions. In contrast, the embodiment of FIG. 4 includes multiple magnetic tunnel junctions offset horizontally from each other, which requires more die area. In addition to the extra die area for the magnetic tunnel junctions, the electrical interconnect required to support the series connection of the magnetic tunnel junctions 420 and 430 may consume additional chip area and require additional processing steps.

The embodiment illustrated in FIG. 4 allows multiple magnetic tunnel junctions that have substantially similar electrical characteristics to be formed and used together. Because each layer included in a magnetic tunnel junction is formed at the same time as the corresponding layer in other tunnel junctions, the thickness of that layer and its characteristics will be substantially similar. As such, if the physical dimensions of the magnetoresistive stacks, or layers within the stacks, of two magnetic tunnel junctions are the same, substantially similar magnetic tunnel junctions can be formed. In addition, because fewer processing steps are required to produce the tunnel junctions in FIG. 4 than are required for the embodiments illustrated in FIGS. 2-3, the various layers within the memory cell are less likely to suffer unwanted degradation resulting from subsequent processing steps. For example, some processing steps may rely on high temperatures that can degrade already formed portions of the memory cell, and reducing the number of such steps can help in complying with an established thermal budget for the memory cell.

In other embodiments where it is desirable to have two different magnetic tunnel junctions coupled in series, the embodiment of FIG. 4 can utilize different sizes for the two magnetic tunnel junctions 420 and 430 in order to realize the desired variations in characteristics between the two magnetic tunnel junctions. For example, in one example, the first magnetic tunnel junction 420 has a certain horizontal dimension, whereas the second magnetic tunnel junction 430 has a horizontal dimension that is twice that of the first magnetic tunnel junction 420. In addition, separate deposition and masking steps may be used to create different magnetic tunnel junction structures within the embodiment illustrated in FIG. 4. For example, a first set of processing steps may be used to form all or part of magnetic tunnel junction 420, and then a second set of processing steps may be used to form some or all of magnetic tunnel junction 430. In yet other embodiments, some processing steps may be used for formation of portions of both magnetic tunnel junctions, where others are not. For example, different tunnel barriers 424 and 434, in terms of dimension or composition, may be created as part of the formation of the magnetic tunnel junctions 420 and 430 in order to provide differentiation, where the other layers remain essentially the same between the two tunnel junctions.

In yet other embodiments including more than two magnetic tunnel junctions, combinations of the embodiments illustrated in FIGS. 2-4 can be used to achieve the desired characteristics for the multiple magnetic tunnel junction memory cells. For example, two pairs of magnetic tunnel junctions formed as a single magnetoresistive stack as in FIG. 3 can be coupled in series in the manner illustrated in FIG. 4 to achieve a 4-MTJ memory cell. It should be appreciated that many different combinations are possible in which multiple magnetic tunnel junctions are used to store a single data bit of information.

While memory cells with magnetoresistive stacks having two tunnel junctions exist in the art, such multiple tunnel junction memory cells fail if either tunnel junction fails. In other words, if repeated reading and writing from such a prior art memory cell results in failure of one of the tunnel barriers, the memory cell is rendered inoperable. In the embodiments illustrated in FIGS. 2-4, if either of the tunnel barriers fails, the operation of the overall memory cell is not compromised as the other still-functioning magnetic tunnel junction provides the redundancy needed to allow for continued read/write capability.

Figure 5:
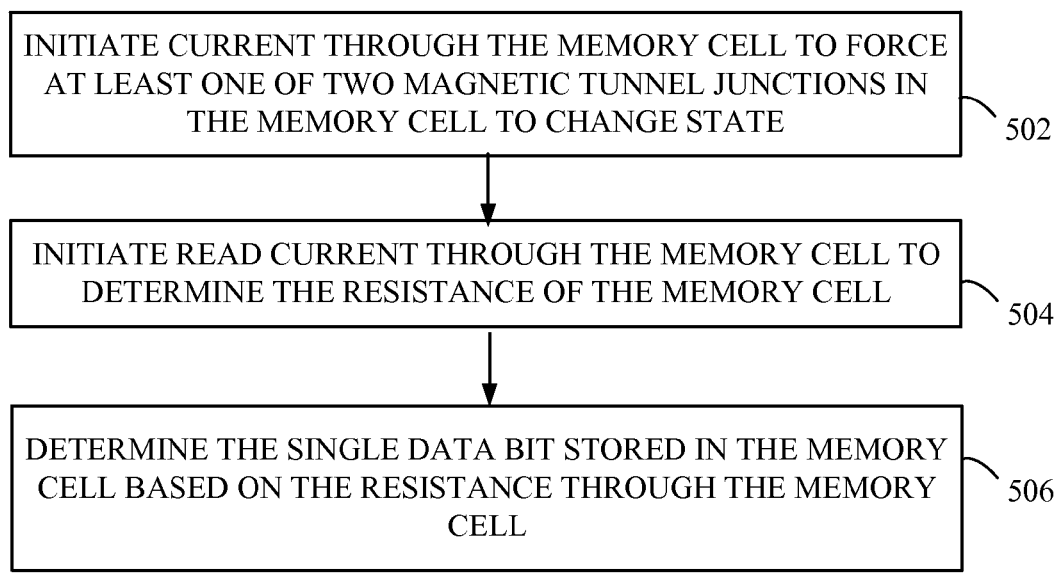
FIG. 5 is a flow chart of a method for accessing a memory cell in accordance with an exemplary embodiment.
Figure 6:
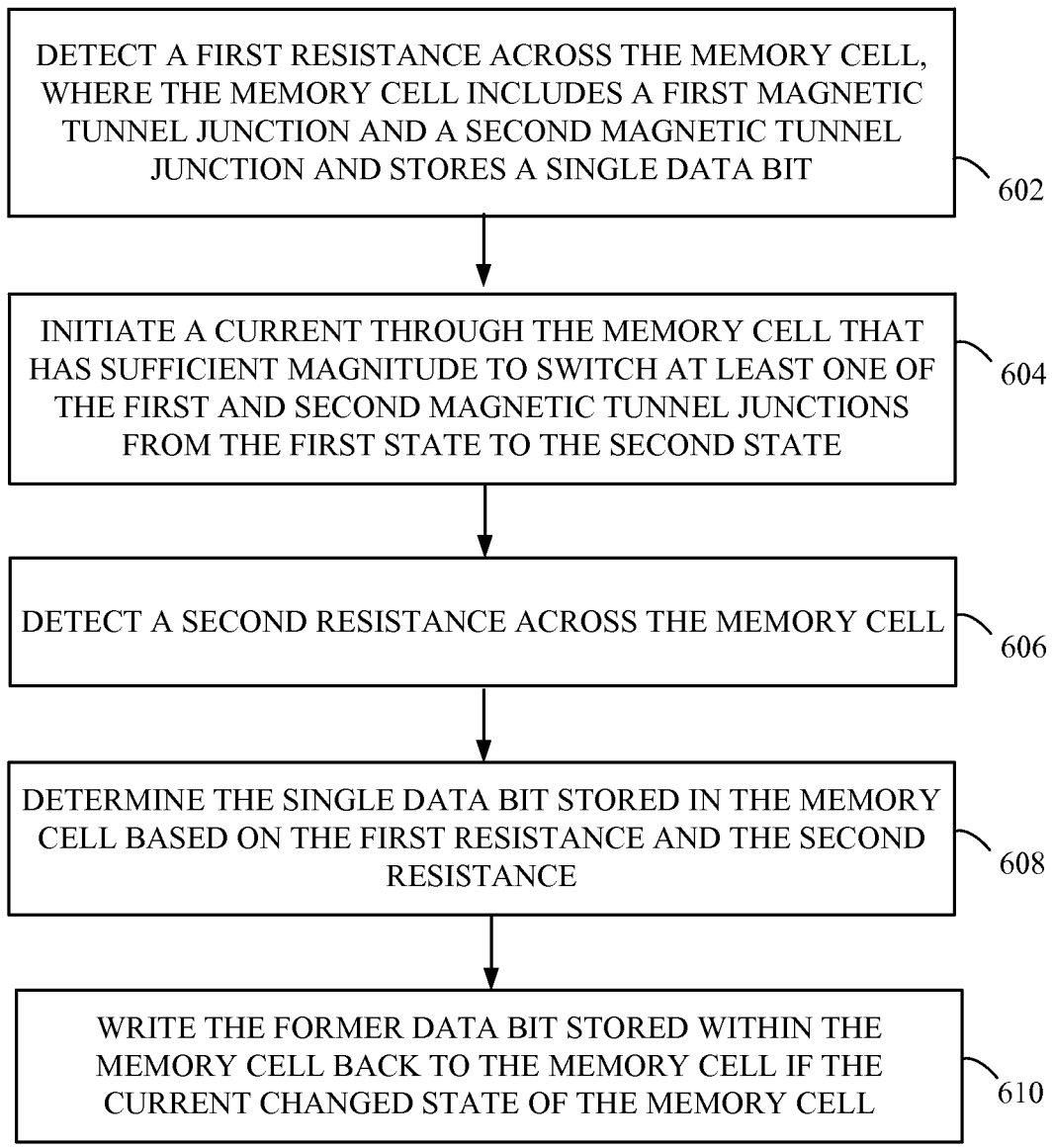
FIG. 6 is a flow chart of a method for accessing a memory cell in accordance with an exemplary embodiment.
Figure 7:
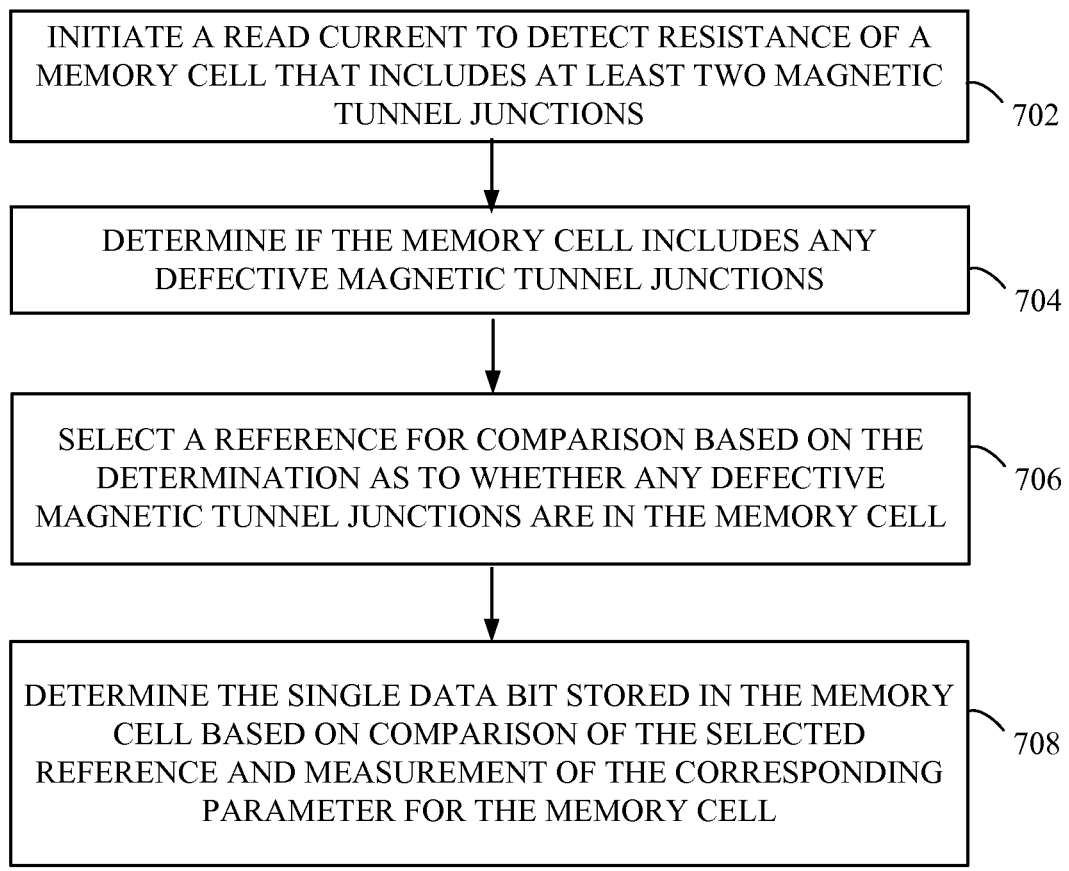
FIG. 7 is a flow chart of a method for reading a single data bit stored in a memory cell in accordance with another exemplary embodiment.

FIGS. 5-7 are flow charts that illustrate exemplary embodiments of a method of accessing a memory cell in a magnetic memory, where the memory cell stores a single data bit using a plurality of magnetic tunnel junctions coupled in series. The operations included in the flow charts may represent only a portion of the overall process used in operating the memory. For illustrative purposes, the following description of the methods in FIGS. 5-7 may refer to elements mentioned above in connection with FIGS. 1-4 as well as FIG. 8, which is discussed below. It should be appreciated that methods may include any number of additional or alternative tasks, the tasks shown in FIGS. 5-7 need not be performed in the illustrated order unless specified otherwise, and the methods may be incorporated into a more comprehensive procedure or process having additional functionality not described in detail herein. Moreover, one or more of the tasks shown in FIGS. 5-7 can be omitted from an embodiment as long as the intended overall functionality remains intact FIG. 5 illustrates a flow chart of a method of accessing a selected memory cell in a magnetic memory, where the memory cell stores a single data bit using a first magnetic tunnel junction and a second magnetic tunnel junction coupled in series. Each of the first and second magnetic tunnel junctions has a respective initial state that is one of a first state, a second state, and a defective state. For example, in the first state the free layer of the magnetic tunnel junction has a first orientation with respect to the fixed layer which results in a first resistance across the magnetic tunnel junction. In the second state the free layer has a second orientation with respect to the fixed layer that results in a second resistance across the magnetic tunnel junction. In the defective state the magnetic tunnel junction is not fully functional (e.g., partially- or fully-shorted), such that if the magnetic tunnel junction where the only magnetic tunnel junction within the memory cell, the memory cell would be nonfunctional.

At 502, programming or writing occurs when current is initiated through the memory cell to cause at least one of the two magnetic tunnel junctions to change state. Initiating the current at 502 may be accomplished by applying a voltage across the memory cell, or by using a fixed current source. In some embodiments, when both magnetic tunnel junctions are functional, a first data value (e.g., "0") is stored in the memory cell by forcing both the first and second magnetic tunnel junctions to assume either the first or second state, where a second data value (e.g., "1") corresponds to when the first and second magnetic tunnel junctions are both in the opposite first or second state. In other embodiments, when both magnetic tunnel junctions are functional, a first data value is stored in the memory cell by forcing only one of the first and second magnetic tunnel junctions to assume either the first or second state, where the second data value is stored by forcing both of the first and second magnetic tunnel junctions to assume the opposite first or second state. Thus, current initiated at step 502 will have a magnitude sufficient to cause at least one of the two magnetic tunnel junctions to change state. If one of the magnetic tunnel junctions is in defective state, then at 502 the current through the memory cell is sufficient to cause the remaining functional magnetic tunnel junction to change state.

Note that the writing performed at step 502 assumes that the memory cell is not already in the state required to store the desired data value. In some cases, the memory cell may already be in the proper state, and, as such, while currents may be sent through the device to force it into that state, no actual change of state occurs.

At 504, a read current is initiated through the memory cell to determine the resistance of the memory cell. Initiating the read current at 504 may be accomplished by applying a voltage across the memory cell, where the amount of current that results from that voltage provides an indication as to the resistance of the memory cell. In other embodiments, a constant current may be supplied through the memory cell where the voltage drop across the memory cell is indicative of the resistance through the memory cell. Because the memory cell includes both the first and second magnetic tunnel junctions, the overall resistance through the memory cell includes the combined resistance through each of those magnetic tunnel junctions.

As discussed above, the resistance through each of the magnetic tunnel junctions is based on the current state of the magnetic tunnel junction when the read current is applied. For example, the resistance of a magnetic tunnel junction in the first state may be greater than the resistance in the second state. The resistance of the magnetic tunnel junction in the defective state is less than the resistance in either the first state or the second state or it may be between those respective resistances. By using the overall resistance through the memory cell, the resistance of both the first and second magnetic tunnel junctions is considered in determining the data bit stored within the memory cell. As such, redundancy is provided in that if either of the magnetic tunnel junctions is in the defective state, the other magnetic tunnel junction can still provide read/write capability.

At 506 the single data bit stored within the memory cell is determined based on the resistance detected at 504. The determination at 506 can be based upon a reference resistance with which the resistance determined at 504 is compared. In one embodiment, a voltage drop across the memory cell corresponding to a constant current applied at 504 is compared with a threshold read voltage where the threshold read voltage delineates between memory cells in which a "0" is stored and memory cells in which a "1" is stored. For example, if both the first and second magnetic tunnel junctions are in the first state and have a relatively low resistance, the resulting voltage drop from a constant current applied may be less than the reference voltage, thereby indicating that a "0" is stored. If one or both of the first and second magnetic tunnel junctions are in the second state and have a higher resistance, additional voltage will appear across the memory cell in response to the same constant current, thereby enabling a determination that a "1" is stored.

When performing the determination step at 506, it may also be necessary to determine if one of the magnetic tunnel junctions is in a defective state such that a different reference should be used to determine if the remaining functional magnetic tunnel junction is in the first state or the second state. Such an embodiment is discussed in additional detail with respect to FIG. 7 below.

In other embodiments, the determination at 506 may utilize a self-referenced read in which the memory cell is written to a known state and the resistance in the known state is detected and compared with the resistance detected at 504. The difference between the resistance in the known state and the resistance detected can be used to determine the data bit stored in the memory cell. Such a self-referenced read operation is discussed in additional detail with respect to FIG. 6 below.

FIG. 6 illustrates a flow chart of a method of reading a data bit stored in memory cell that includes first and second magnetic tunnel junctions where only a single data bit is stored. The method corresponding to FIG. 6 utilizes a self-referenced reading technique to ascertain the data bit stored within the memory cell. At 602 a first resistance value across the memory cell is detected. The first resistance value depends on the initial states of the first and second magnetic tunnel junctions, where each magnetic tunnel junction has an initial state that is one of the first state, a second state, and a defective state. In some embodiments, the first state corresponds to a lower resistance state and the second state corresponds to a higher resistance state. In other embodiments, the first state corresponds to a higher resistance state and the second state corresponds to a lower resistance state.

Detecting the resistance across the memory cell at 602 may include applying a constant current and determining the voltage drop across the memory cell. In other embodiments, a fixed voltage is established across the memory cell, and the current flow through the memory cell is detected and used to determine the resistance of the memory cell.

After detecting the first resistance at 602, a current is initiated through the memory cell at 604, where when at least one of the first and second magnetic tunnel junctions is in the first state, the current has sufficient magnitude to switch at least one of the first and second magnetic tunnel junctions from the first state to the second state. Thus, if both the first and second memory cells are already in the second state, no change will occur. However, if one or both of the first and second magnetic tunnel junctions are in the first state, one or both of the magnetic tunnel junctions will be switched from the first state to the second state. Note that the current initiated at 604 is sufficient in magnitude such that if one of the two magnetic tunnel junctions is in the first state, and the other magnetic tunnel junction is in the defective state, the functional magnetic tunnel junction will be caused to switch from the first state to the second state. The current initiated at 604 may be applied by a current source or generated by applying a programming voltage across the memory cell. Thus, by initiating the current at 604, the memory cell is reset to a known state to provide a reference for comparison with the initial state of the memory cell.

After initiating the current at 604, at 606 a second resistance across the memory cell is detected. The second resistance depends on the resulting states of the first and second magnetic tunnel junctions after the current is initiated at 604. If both the first and second magnetic tunnel junctions were initially in the second state, the second resistance detected at 606 should be about the same as the first resistance detected at 602 (i.e. the difference between the two is relatively small). If, however, one or both of the first and second magnetic tunnel junctions was initially in the first state and the current initiated at 604 has caused one or more of the first and second magnetic tunnel junctions to switch to the second state, the resistance detected at 606 should be significantly different than that detected at 602.

At 608 the single data bit stored within the memory cell is determined based on the first resistance and the second resistance. For example, if the first and second resistances are approximately the same, it is determined that both of the magnetic tunnel junctions were initially in the second state, which, in some embodiments, corresponds to a binary "0". Similarly, if the first and second resistances are different, that indicates that the first magnetic tunnel junction and/or second magnetic tunnel junction transitioned from an initial first state to a second state based on the current initiated at 604. In the example embodiment where both magnetic tunnel junctions in the second state corresponds to a binary "0", one or both of the magnetic tunnel junctions initially in the first state corresponds to a binary "1". Because the self-referenced read can destroy the initial state of the magnetic tunnel junctions within the memory, if the self-referenced read resulted in a change of state for one or both of the magnetic tunnel junctions, the former value stored within the memory cell is written back to the memory cell at 610. Notably, reading the single data bit stored in the memory cell may result in the single data bit read being temporarily stored in a sense amplifier or other short term storage location accessible to a user for reading and writing. If the user modifies the data bit while in temporary storage, whether or not a write-back operation is required will be based on the data bit in the temporary storage when access to the data therein is finished.

It should be appreciated that the self-referenced reading technique illustrated in FIG. 6 functions even if one of the two magnetic tunnel junctions is in the defective state. Because the resistance of a magnetic tunnel junction in the defective state is relatively constant, the other functioning magnetic tunnel junction will still exhibit resistance changes when it is toggled between the first and second state. As such, the additional magnetic tunnel junction provides redundancy for the memory cell as only a single data bit stored therein.

Figure 9:
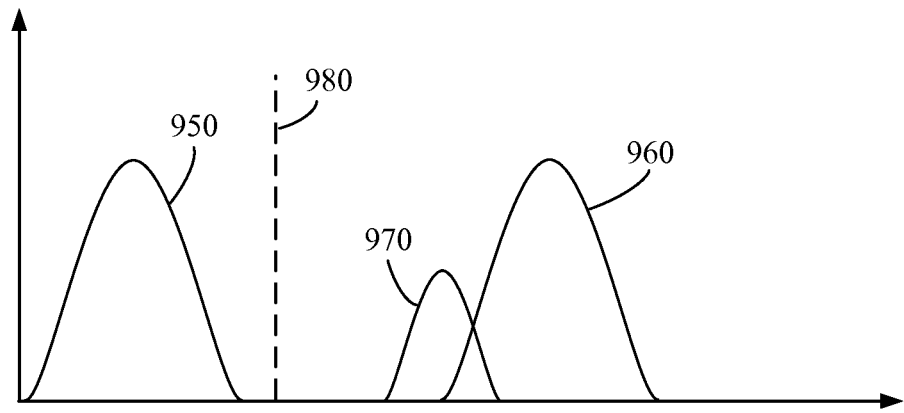
FIG. 9 provides a graph showing read signal distributions of memory cells in a magnetic memory in accordance with an exemplary embodiment.

The graph provided in FIG. 9 helps to illustrate the different read signals associated with the possible states of the magnetic tunnel junctions within the memory cell. In some embodiments where a constant read voltage is applied to the memory cells and the resulting current is measured, the read signal is defined as the difference in current measured in steps 606 and 602. The horizontal axis FIG. 9 corresponds to the read signal across a memory cell. The curve 950 represents the distribution of read signals for memory cells in a memory device in which none of the magnetic tunnel junctions switched after application of the reset current in step 604. Curve 960 represents the distribution of read signals for memory cells in which both magnetic tunnel junctions switched after application of the reset current in step 604. Curve 970 represents the distribution of read signals for memory cells in which one magnetic tunnel junction is switched after application of the reset current in step 604 and the other magnetic tunnel junction is not switched because it is defective or for some other reason. As can be seen from the graph, a defective magnetic tunnel junction reduces the overall read signal of the memory cell. However, by having sufficient margin and placing the reference resistance value 980 at a position between the curves 950 and 970, accurate determinations of the single data bit stored in each memory cell still occur when a defective magnetic tunnel junction is present.

In some embodiments, when both magnetic tunnel junctions are functioning, the first data value (e.g. binary "0") is represented by the first and second magnetic tunnel junctions both being in the first state, and the second data value (e.g. binary "1") is represented by both the first and second magnetic tunnel junctions being in the second state. The programming voltage required to force both the first and second magnetic tunnel junctions from the first state to the second state is typically different from the programming voltage required to force both the first and second magnetic tunnel junctions from the second state to the first state. This is because of a voltage divider that exists based on the series connection of the magnetic tunnel junctions with the selection transistor. As such, moving both of the magnetic tunnel junctions from the first state to the second state may require significantly higher voltage then moving both magnetic tunnel junctions from the second state to the first state. In embodiments that use a programming voltage to change the states of the magnetic tunnel junctions instead of a constant current source, the second data value may be represented by only one of the first and second magnetic tunnel junctions being in the second state instead of both being in the second state. Using such a "half switched" memory cell in which only one of the two magnetic tunnel junctions switches to store the second data value can have advantages in terms of speed and power savings. The resistance change when only one magnetic tunnel junction changes state may be reduced in comparison to the resistance changed when both magnetic tunnel junctions change state, but when sufficient margin exists, this lower magnetoresistance can still be detected and used to store the data value, as illustrated FIG. 9.

Within the context of the embodiment of FIG. 6, a few scenarios are provided to help illustrate the concepts disclosed herein. In one embodiment, the first magnetic tunnel junction is initially in the defective state and the second magnetic tunnel junction is initially in the first state. In such an embodiment, initiating the current at 604 includes initiating the current in a first direction that switches the second magnetic tunnel junction from the first state to the second state. Thus, although the first magnetic tunnel junction is defective and is no longer operating properly, the method of FIG. 6 is still able to ascertain the initial state of the second magnetic tunnel junction, and the second magnetic tunnel junction is able to support ongoing reading and writing operations.

In another scenario, both the first and second magnetic tunnel junctions are initially in the first state at 602. Initiating the current at 604 includes initiating the current in a first direction that switches both the first and second magnetic tunnel junctions from the first state to the second state. In such an embodiment, the current used to set the reference state for the memory cell relies on the maximum movement of the resistance within the memory cell.

In a third example, the first and second magnetic tunnel junctions are both initially and the first state, but the current initiated 604 only switches one of the first and second magnetic tunnel junctions from the first state to the second state.

Notably, forcing the memory cell to a known state as a part of a self-referenced read operation may not be the same as programming or writing to the memory cell, which results in the memory cell storing a "0" or a "1". For example the first data value (e.g. "0") may correspond to the first and second magnetic tunnel junctions being in the first state, while the second data value corresponds to either 1) at least one magnetic tunnel junction being in the second state or 2) both of the magnetic tunnel junctions being in the second state. Thus, the current used to program the memory cell may be different than the current used to force the memory cell to a known state for a self-referenced read operation.

FIG. 7 illustrates a flow chart of a method of reading a data bit stored in memory cell that includes multiple magnetic tunnel junctions where only a single data bit is stored using the multiple magnetic tunnel junctions. At 702, a read current is initiated to detect the resistance of the memory cell. The resistance of the memory cell includes components from each of the magnetic tunnel junctions included therein.

At 704, it is determined whether or not the memory cell includes defective magnetic tunnel junctions. The resistance of the memory cell detected at 702 may be stored or otherwise retained prior to the determination at 704. The determination at 704 can be accomplished by first initiating a write current through the memory cell that is directed to setting the memory cell to a low-resistance state. Following the write current, the resistance across the memory cell is detected and compared with a reference that corresponds to the expected resistance across a memory cell in the low resistance state. If the comparison indicates that the detected resistance is within a certain range of the reference (i.e. they are generally equal), both of the magnetic tunnel junctions are functional. If the comparison indicates that the detected resistance across the memory cell is significantly less than that of the reference (i.e. outside of an expected distribution of the resistance through the memory cell when both magnetic tunnel junctions are in the low-resistance state), at least one of the magnetic tunnel junctions is defective.

Figure 10:
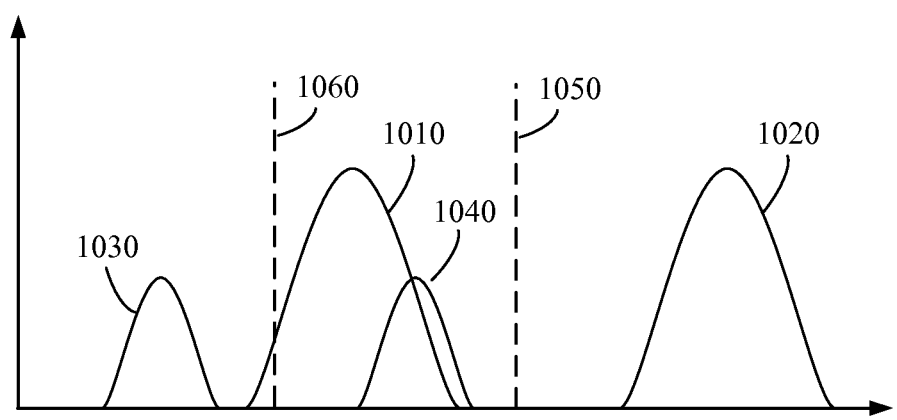
FIG. 10 provides a graph showing read signal distributions of memory cells in a magnetic memory in accordance with an exemplary embodiment.

The graph provided in FIG. 10 helps to illustrate the different possible states of the magnetic tunnel junctions within the memory cell. The horizontal axis corresponds to the total read signal across a memory cell, which may correspond to the resistance across the memory cell. The curve 1010 represents the distribution of resistances for memory cells in a memory device in which both of the magnetic tunnel junctions are in the low resistance state. Curve 1020 represents the distribution of memory cells in which both magnetic tunnel junctions are in the higher-resistance state. Curve 1030 represents the distribution of memory cells in which one magnetic tunnel junction is in the lower-resistance state and the other is defective. Curve 1040 represents the distribution of memory cells in which one magnetic tunnel junction is in the higher-resistance state and the other is defective. Once the determination as to whether or not any defective magnetic tunnel junctions are included in the memory cell has been made, a reference used to detect the current state of the memory cell can be selected at 706 in FIG. 7. If no defective magnetic tunnel junction is detected, the reference level 1050 is chosen between 1010 and 1020. If a defective magnetic tunnel junction is detected, the reference level 1060 is chosen between 1030 and 1040. A different reference may be used to determine which of the two data values is stored in the memory cell with a defective magnetic tunnel junction then would be used if all the magnetic tunnel junctions in the memory cell were fully functional.

At 708, the single data bit stored in the memory cell is determined based on a comparison between the selected reference and measurement of the corresponding parameter for the memory cell. For example, if the selected reference is a voltage reference, the voltage drop across the memory cell for a known current can be compared with the selected voltage reference. If the selected reference is a resistance value, the resistance of the memory cell can be compared with the selected resistance reference. In yet other embodiments, a current reference may be employed, where the resulting current through the memory cell for a known applied voltage across the memory cell is compared with the selected current reference. In each case, the result of the comparison determines the single data bit stored within the memory cell which takes into account the present state of each of the magnetic tunnel junctions within the memory cell.

Figure 8:
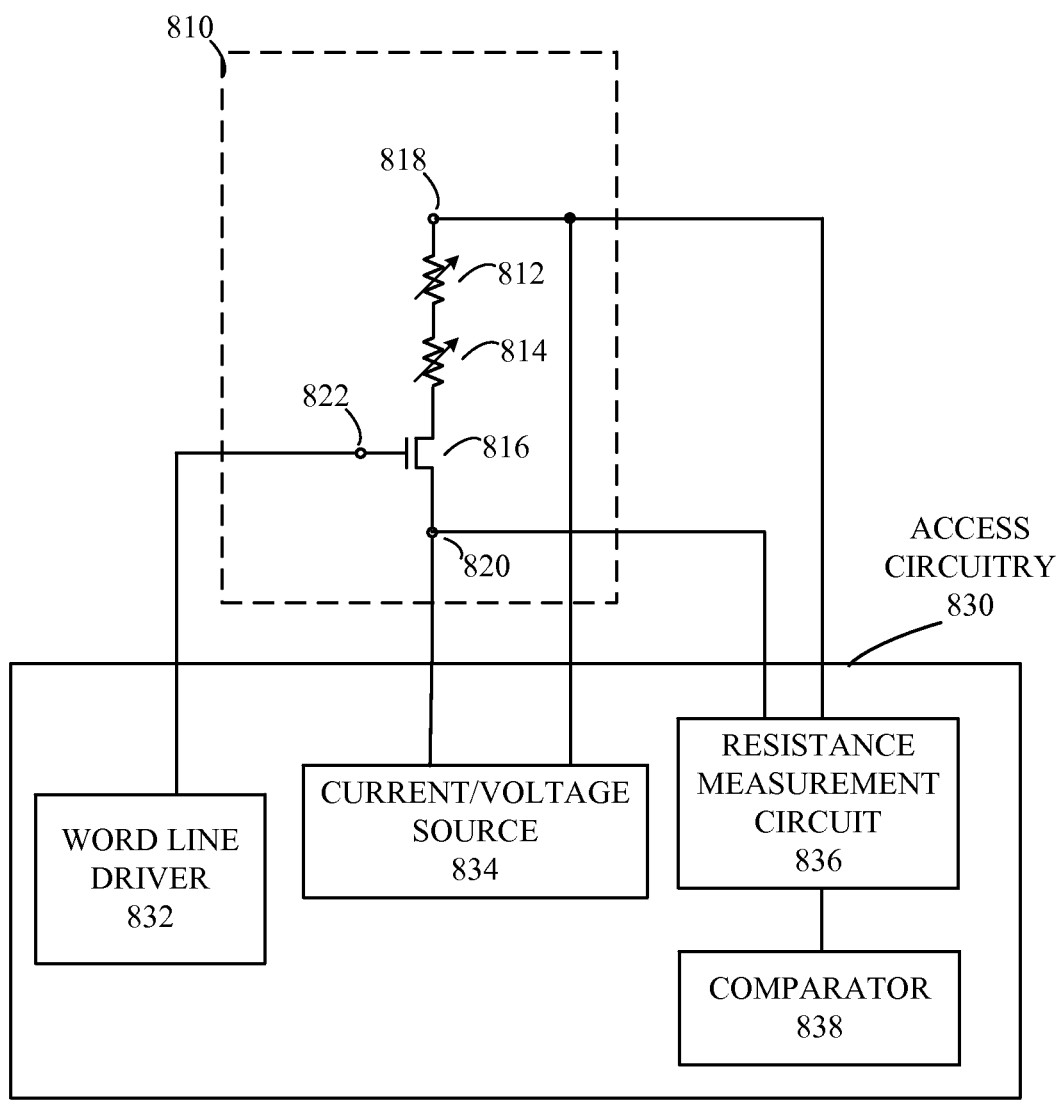
FIG. 8 is a block diagram of a portion of a magnetoresistive memory in accordance with an exemplary embodiment.

FIG. 8 illustrates a schematic block diagram of a portion of a magnetoresistive memory. A memory cell 810 includes a first magnetic tunnel junction 812, a second magnetic tunnel junction 814, and a selection transistor 816. As discussed above, the resistance of the first magnetic tunnel junction 812 is based on the state of the free layer within the first magnetic tunnel junction 812. Similarly, the resistance of the second magnetic tunnel junction 814 is based on the state of the free layer within the second magnetic tunnel junction 814. As shown, the first and second magnetic tunnel junctions 812 and 814 are coupled in series. A single data bit is stored within the memory cell 810, where the data bit is stored using the first and second magnetic tunnel junctions 812 and 814.

In some embodiments, the first and second magnetic tunnel junctions 812 and 814 are substantially the same in structure such that they have similar electrical characteristics. In other embodiments, the first magnetic tunnel junction 812 and the second magnetic tunnel junction 814 have different physical dimensions. For example, the tunnel barrier of the first magnetic tunnel junction 812 may be thicker than that of the second magnetic tunnel junction 814. As another example, the first magnetic tunnel junction 812 may have a horizontal dimension that differs from that of the second magnetic tunnel junction 814 (e.g. it may be twice as wide). In other embodiments, different materials may be used within the different layers of the respective magnetic tunnel junctions such that their electrical characteristics are differentiated in that manner.

As illustrated in and discussed with respect to FIGS. 2 and 3 above, the first magnetic tunnel junction 812 may be offset vertically from the second magnetic tunnel junction 814 within the memory. In such embodiments, the first magnetic tunnel junction 812 may be coupled to the second magnetic tunnel junction 814 using a conductor within an interlayer dielectric within the memory. In embodiments consistent with FIG. 3, the two magnetic tunnel junctions 812 and 814 are included in a single magnetoresistive stack. In other embodiments consistent with FIG. 4, the first magnetic tunnel junction 812 may be offset horizontally from the second magnetic tunnel junction 814 within the memory.

Access circuitry 830 coupled to the memory cell is configured to determine the single data bit stored in the memory cell based on the sum of the first and second resistances of the first and second magnetic tunnel junctions 812 and 814. A word line driver 832 within the access circuitry is used to select the memory cell 810 for access based on driving the gate 822 of the selection transistor 816 to a voltage that enables current to pass through the memory cell 810.

The access circuitry 830 includes signal lines that can be selectively coupled to nodes 818 and 820 of the memory cell 810 to selectively apply voltages across the memory cell 810 and/or currents through memory cell 810. In some embodiments, the signal lines correspond to source lines and bit lines within the memory. Sense amplifiers and write drivers enable read and write currents to be passed through selected memory cells to both store information and later retrieve that information. As also noted above, example of such sense amplifiers, write drivers, and related circuitry are discussed in U.S. Pat. No. 8,811,071.

In the embodiment illustrated in FIG. 8, the access circuitry 830 is shown to include a current/voltage source 834 that initiates current through the memory cell 810. In order to initiate current through the memory cell 810, the current/voltage source 834 either acts as a current source or selectively applies a voltage across the memory cell 810. Thus, some embodiments may rely on a constant or controllable current level through the memory cell for reading and writing, whereas other embodiments may rely on a voltage source to apply a controlled amount of voltage across the memory cell 810.

Based on the current initiated by the current/voltage source 834, a resistance measurement circuit is used to detect the resistance across the entirety of the memory cell 810, which includes the resistance through each of the magnetic tunnel junctions 812 and 814. The resistance measurement circuit, which may be part of a sense amplifier, determines the resistance through the memory cell based on, for example, a voltage drop across the memory cell 810 when a known current is applied. In other embodiments, resistance is measured based on an amount of current that flows through the memory cell 810 in response to an applied voltage across the memory cell 810.

A comparator 838, which may also be part of a sense amplifier, is coupled to the resistance measurement circuit 836. The comparator is configured to determine the single data bit stored in the memory based on the first resistance of the first magnetic tunnel junction 812 and the second resistance of the magnetic tunnel junction 814. In some embodiments, the comparator 838 compares a measured resistance value of the memory cell 810 with a selected reference, where the selected reference may be based in part on whether either of the first magnetic tunnel junction 812 or the second magnetic tunnel junction 814 is in a defective state.

In other embodiments, the access circuitry 830 uses a self-referenced read to determine the data bit stored in the memory cell 810. In such a self-referenced read, the resistance measurement circuit 830 is configured to detect a first resistance across the memory cell 810 prior to the current/voltage source 834 initiating a first current through the memory cell to establish a first state in the memory cell. The resistance measurement circuit 830 is also configured to detect a second memory cell resistance across the memory cell after initiation of the first current such that the resistance of the memory cell in a known state can be used to determine the initial state of the memory cell and, as a result, the data bit stored therein.

As discussed above, the access circuitry 830 is able to determine the data bit stored within the memory cell 810 even when one of the first and second magnetic tunnel junctions 812 and 814 is in a defective state. Thus, in a memory that includes an array of multiple-magnetic tunnel junction memory cells, the access circuitry will be able to read from and write to each memory cell in the array even if some of the memory cells include a magnetic tunnel junction in the defective state. The access circuitry 830 may include additional circuitry to detect when one of the magnetic tunnel junctions 812 and 814 is in the defective state, where such a determination can be used to adjust a reference used to determine the data bit stored within the memory cell 810.

When the access circuitry 830 programs, or writes to, the memory cell 810, the access circuitry initiates a first write current through the memory cell in a first direction to store a first data value (e.g. "0"). In order to store a second data value (e.g. "1"), to circuitry initiates second write current through the memory cell in a second direction that is opposite to the first direction. In some embodiments, the magnitude of each of the first and second write currents is sufficient to force both of the magnetic tunnel junctions 812 and 814 to a first or second state, whereas in other embodiments, the magnitude of the first write current may only force one of the magnetic tunnel junctions 812 and 814 to the first state, whereas the second write current forces both magnetic tunnel junctions 812 and 814 to the second state.

By storing a single bit in a memory cell that includes multiple magnetic tunnel junctions, some redundancy is provided such that the failure of a single magnetic tunnel junction does not result in overall memory cell failure. Such redundancy provides improved bit error rate. Having at least two magnetic tunnel junctions coupled in series in each memory cell also helps improve electrical distributions across the memory device as aberrations in one magnetic tunnel junction are diluted by the other magnetic tunnel junction(s) in the same memory cell. In some embodiments, the array of memory cells within a magnetoresistive memory may include both single magnetic tunnel junction memory cells and multiple-magnetic tunnel junction memory cells such as those depicted in FIGS. 1-4, where the multiple-magnetic tunnel junction memory cells provide additional robustness in terms of operation.

While exemplary embodiments have been presented above, it should be appreciated that many variations exist. Furthermore, while the description uses spin-torque MRAM devices that include memory cells in a specific example arrangements, the teachings may be applied to other devices having different architectures in which the same concepts can be applied. For example, techniques other than spin-torque may be used to switch or assist the switching of the state of the magnetic tunnel junctions within the memory cells. Examples of such techniques include spin orbit torque switching, spin Hall effect, and voltage controlled magnetic anisotropy. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A magnetoresistive memory comprising:
   a memory cell that stores a single data bit, the memory cell including:
      a first magnetic tunnel junction having a first resistance; and
      a second magnetic tunnel junction having a second resistance, wherein the first and second magnetic tunnel junctions are coupled in series; and
   access circuitry coupled to the memory cell, wherein the access circuitry is configured to determine the single data bit stored in the memory cell based on a sum of the first and second resistances.

2. The memory of claim 1, wherein one of the first and second resistances corresponds to a resistance for a magnetic tunnel junction in a defective state.

3. The memory of claim 1, wherein the access circuitry includes:
   a current source configured to initiate current through the memory cell;
   a resistance measurement circuit configured to:
      detect a first memory cell resistance across the memory cell prior to the current source initiating a first current through the memory cell to establish a first state in the memory cell; and
      detect a second memory cell resistance across the memory cell after initiation of the first current; and
   a comparator coupled to the resistance measurement circuit, the comparator configured to determine the single data bit stored in the memory cell based on a difference between the first memory cell resistance and the second memory cell resistance.

4. The memory of claim 3, wherein the current source of the access circuitry is further configured to initiate a first write current through the memory cell in a first direction and a second write current through the memory cell in a second direction, wherein the first write current stores a first data value and the second write current stores a second data value.

5. The memory of claim 4, wherein the first write current stores the first bit value by only changing state of one of the first and second magnetic tunnel junctions.

6. The memory of claim 1, wherein the memory cell is included in an array of memory cells in the magnetoresistive memory, each memory cell in the array of memory cells storing a corresponding single data bit, wherein at least one memory cell in the array of memory cells includes a defective magnetic tunnel junction, and wherein the access circuitry is configured to determine the corresponding single data bit stored in each memory cell in the array of memory cells, including the corresponding single data bit stored in the at least one memory cell that includes a defective magnetic tunnel junction.

7. The memory of claim 1, wherein the first and second magnetic tunnel junctions are substantially similar in structure.

8. The memory of claim 1, wherein the first magnetic tunnel junction and the second magnetic tunnel junction have different physical dimensions.

9. The memory of claim 1, wherein the first magnetic tunnel junction is offset vertically from the second magnetic tunnel junction within the memory.

10. The memory of claim 1, wherein the first magnetic tunnel junction is offset horizontally from the second magnetic tunnel junction within the memory.

11. The memory of claim 1, wherein the first and second tunnel junctions are coupled in series using a conductor within an interlayer dielectric within the memory.

12. The memory of claim 1, wherein one of the first and second resistances corresponds to a resistance for a magnetic tunnel junction in a defective state; and
   wherein the access circuitry includes:
      a current source configured to initiate current through the memory cell;
      a resistance measurement circuit configured to:
         detect a first memory cell resistance across the memory cell prior to the current source initiating a first current through the memory cell to establish a first state in the memory cell; and
         detect a second memory cell resistance across the memory cell after initiation of the first current; and
      a comparator coupled to the resistance measurement circuit, the comparator configured to determine the single data bit stored in the memory cell based on a difference between the first memory cell resistance and the second memory cell resistance.

13. The memory of claim 12, wherein the current source of the access circuitry is further configured to initiate a first write current through the memory cell in a first direction and a second write current through the memory cell in a second direction, wherein the first write current stores a first data value and the second write current stores a second data value.

14. The memory of claim 1, wherein one of the first and second resistances corresponds to a resistance for a magnetic tunnel junction in a defective state; and wherein the first magnetic tunnel junction and the second magnetic tunnel junction have different physical dimensions.

15. The memory of claim 1, wherein one of the first and second resistances corresponds to a resistance for a magnetic tunnel junction in a defective state; and wherein the first magnetic tunnel junction is offset vertically from the second magnetic tunnel junction within the memory.

16. The memory of claim 1, wherein one of the first and second resistances corresponds to a resistance for a magnetic tunnel junction in a defective state; and wherein the first magnetic tunnel junction is offset horizontally from the second magnetic tunnel junction within the memory.

17. The memory of claim 1, wherein one of the first and second resistances corresponds to a resistance for a magnetic tunnel junction in a defective state; and wherein the first and second tunnel junctions are coupled in series using a conductor within an interlayer dielectric within the memory.

18. The memory of claim 1, wherein the first magnetic tunnel junction and the second magnetic tunnel junction are substantially similar in structure; and wherein the access circuitry includes:
a current source configured to initiate current through the memory cell;
a resistance measurement circuit configured to:
   detect a first memory cell resistance across the memory cell prior to the current source initiating a first current through the memory cell to establish a first state in the memory cell; and
   detect a second memory cell resistance across the memory cell after initiation of the first current; and
a comparator coupled to the resistance measurement circuit, the comparator configured to determine the single data bit stored in the memory cell based on a difference between the first memory cell resistance and the second memory cell resistance.

19. The memory of claim 1, wherein the first magnetic tunnel junction and the second magnetic tunnel junction have different physical dimensions; and
   wherein the access circuitry includes:
   a current source configured to initiate current through the memory cell;
   a resistance measurement circuit configured to:
      detect a first memory cell resistance across the memory cell prior to the current source initiating a first current through the memory cell to establish a first state in the memory cell; and
      detect a second memory cell resistance across the memory cell after initiation of the first current; and
   a comparator coupled to the resistance measurement circuit, the comparator configured to determine the single data bit stored in the memory cell based on a difference between the first memory cell resistance and the second memory cell resistance.

20. The memory of claim 1, wherein the first magnetic tunnel junction and the second magnetic tunnel junction have different physical dimensions, wherein the first magnetic tunnel junction is offset vertically from the second magnetic tunnel junction within the memory; and
   wherein the access circuitry includes:
   a current source configured to initiate current through the memory cell;
   a resistance measurement circuit configured to:
      detect a first memory cell resistance across the memory cell prior to the current source initiating a first current through the memory cell to establish a first state in the memory cell; and
      detect a second memory cell resistance across the memory cell after initiation of the first current; and
   a comparator coupled to the resistance measurement circuit, the comparator configured to determine the single data bit stored in the memory cell based on a difference between the first memory cell resistance and the second memory cell resistance.

* * * * *